United States Patent [19]

Yamazaki

[11] Patent Number: 5,474,975
[45] Date of Patent: Dec. 12, 1995

[54] METHOD FOR MANUFACTURING AN ELONGATED MEMBER FROM A SUPERCONDUCTING CERAMIC MATERIAL

[75] Inventor: Shumpei Yamazaki, Tokyo, Japan

[73] Assignee: Semiconductor Energy Laboratory Co., Ltd., Kanagawa, Japan

[21] Appl. No.: 485,854

[22] Filed: Feb. 22, 1990

Related U.S. Application Data

[63] Continuation of Ser. No. 174,165, Mar. 28, 1988, abandoned.

[30] Foreign Application Priority Data

Apr. 1, 1987 [JP] Japan .................................. 62-81488
Apr. 1, 1987 [JP] Japan .................................. 62-81489

[51] Int. Cl.⁶ .............................. B05D 5/12; H01L 39/24
[52] U.S. Cl. ........................ 505/433; 29/599; 505/430; 427/62
[58] Field of Search ................................ 29/599; 419/4; 428/614; 505/704, 430, 1, 880, 885, 433; 138/140, 143, 177, 178; 174/15.4, 15.5, 126.4; 427/62

[56] References Cited

U.S. PATENT DOCUMENTS

| | | | |
|---|---|---|---|
| 2,139,431 | 12/1938 | Vatter | 113/112 |
| 2,332,891 | 10/1943 | Clark | 175/41 |
| 3,205,413 | 9/1965 | Anderson . | |
| 3,310,433 | 3/1967 | Tragert | 117/213 |
| 3,428,926 | 2/1967 | Bogner et al. | 335/216 |
| 3,444,495 | 5/1969 | Thomas | 336/223 |
| 3,447,913 | 6/1969 | Yntema | 428/614 X |
| 3,472,944 | 10/1969 | Morton et al. | 174/15 |
| 3,713,211 | 1/1973 | Freeman, Jr. | 29/599 |
| 3,728,463 | 4/1973 | Kullmann et al. | 174/12 |

(List continued on next page.)

FOREIGN PATENT DOCUMENTS

| | | | |
|---|---|---|---|
| 52-69295 | 6/1977 | Japan | 29/599 |
| 54-22592 | 8/1979 | Japan | 29/599 |
| WO88/08618 | 11/1988 | United Kingdom . | |

OTHER PUBLICATIONS

Proc Intr Conf Low Temp. Physics Kyoto, 1987 Japanese Journal Appl Physics, vol. 26 (1987) Supplement 26-3, Superconducting Wires of High $T_c$ Oxides by K. Ohmatsu et al.

"Y–Ba–Cu–O Films Prepared By a Paint-on Method" Appl. Phys. Lett., vol. 52 No. 9, 29 Feb. 1988 I. Shih and C. X. Qiu, pp. 748–750.

"Ba–Y–Cu–O Superconducting Tape Prepared by Surface Diffusion Process", vol. 26, No. 7, Jul. 1987, pp. L1172–L1173 Hiroaki Kumakura et al., National Research Institute for Metals.

"Preparation of Superconducting Y–Ba–Cu–O Thick Film", Japanese Journal of Applied Physics, vol. 27, No. 3, Mar., 1988, pp. L420–L422, Mineo Itoh and Hiroyuki Ishigaki.

"High $T_c$ Superconductors—Composite Wire Fabrication", Appl. Phys. Lett. 51(3), 20 Jul. 1987, pp. 203–204 1987 American Institute of Physics, S. Jin et al.

"High $T_c$ Superconducting Y–Ba–Cu–O Thick Film By Screen Printing", H. H. Yen et al., Materials Research Laboratories, Industrial Technology Research Institute Nov. 30–Dec. 4, 1987.

"Bulk Superconductivity at 36K in $La_{1.8}Sr_{0.2}CuO_4$" by R. J. Cava et al., Physical Review Letters, vol. 58, No. 4, Jan. 26, 1987.

*Primary Examiner*—Carl J. Arbes
*Attorney, Agent, or Firm*—Sixbey, Friedman, Leedom & Ferguson; Gerald J. Ferguson, Jr.

[57] ABSTRACT

A method for manufacturing an elongated member from a superconducting ceramic material comprising the steps of providing a hollow supporting body of metal or a metallic alloy having a hollow inside section therein, introducing a superconducting ceramic material into the hollow inside section of the hollow supporting body, drying the above liquid, so that the superconducting ceramic material is coated on the inside of the supporting body; and firing the supporting body and the ceramic material in an oxidizing atmosphere.

32 Claims, 1 Drawing Sheet

U.S. PATENT DOCUMENTS

| | | | |
|---|---|---|---|
| 3,864,807 | 2/1975 | Schneider et al. | 428/614 X |
| 3,963,425 | 6/1976 | Sambrook | 428/614 X |
| 4,329,539 | 5/1982 | Tanaka et al. | 174/128 |
| 4,421,946 | 12/1983 | Furuto et al. | 174/128 |
| 4,492,089 | 1/1985 | Rohner et al. | 62/55 |
| 4,571,453 | 2/1986 | Takaoka et al. | 174/110 |
| 4,640,816 | 2/1987 | Atzmon | 29/599 X |
| 4,704,249 | 11/1987 | Glatzle | 29/599 X |
| 4,754,249 | 6/1988 | Yamamoto et al. | 335/216 |
| 4,785,142 | 11/1988 | Smith et al. | 174/15 |
| 4,804,649 | 2/1989 | Sherif | 505/1 |
| 4,813,332 | 3/1989 | Jasper, Jr. | 89/8 |
| 4,843,059 | 6/1989 | Deslandes et al. | 505/1 |
| 4,885,273 | 12/1989 | Sugimoto et al. | 505/433 |
| 4,952,554 | 8/1990 | Jin et al. | 505/1 |
| 5,006,507 | 4/1991 | Woolf et al. | 505/1 |
| 5,011,823 | 4/1991 | Jin et al. | 505/740 X |
| 5,044,406 | 3/1991 | Yamazaki | 138/143 |
| 5,081,075 | 1/1992 | Jin et al. | 29/599 X |
| 5,100,865 | 3/1992 | Yamamoto et al. | 427/62 X |

5,474,975

METHOD FOR MANUFACTURING AN ELONGATED MEMBER FROM A SUPERCONDUCTING CERAMIC MATERIAL

This application is a continuation of Ser. No. 07/174,165, filed Mar. 28, 1988, now abandoned.

FIELD OF THE INVENTION

The present invention relates to a method for manufacturing an elongated member such as pipe or wire from a ceramic superconducting material, and in particular to a method for manufacturing a pipe or wire for fabricating a coil for use in a superconducting magnet or in an electrical accumulator device.

BACKGROUND OF THE INVENTION

Conventionally, a metallic material such as Nb—Ge (for example, $Nb_3Ge$) and the like is used as a superconducting material. Because this material is a metal, it has high ductility, malleability, and flexure and can be used to construct a coil for use in a superconducting magnet and also a coil for use in an electrical accumulator coil.

However, the onset of the superconducting critical temperature (hereinafter referred to as Tc) of this metal is low, being only 23° K. or lower. On the other hand, for industrial applications, it is extremely important that the Tc be 100° K. or higher, and that the temperature where the electrical resistance becomes zero (hereinafter referred to as Tco) be 77° K. or higher.

Recently, a copper oxide ceramic superconducting material has been attracting considerable attention as such a superconducting material. However, this copper oxide ceramic superconducting material is not necessarily adequate in ductility, malleability, and flexure. Also, there is a problem that processing the material after it is formed is extremely difficult.

For these reasons, no method is as yet known for preparing this copper oxide ceramic superconducting material for use in the form of a coil, nor is any structure with such a coil known wherein a cooling medium can be incorporated therein for cooling the material.

SUMMARY OF THE INVENTION

An object of the present invention is to provide, with due consideration to the drawbacks of such conventional devices, a method for manufacturing an elongated member such as pipe or wire from a ceramic superconducting material.

A further object of the present invention is to provide a method for manufacturing an elongated member such as pipe or wire for fabricating a coil for use in a superconducting magnet or in an electrical accumulator device.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
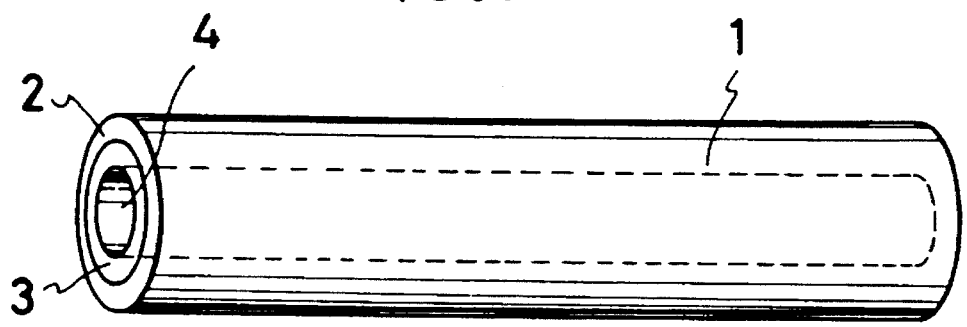
FIG. 1 shows a superconducting ceramic pipe of the present invention.

To satisfy the objects of the present invention, a hollow body of metal or metallic alloy is used as a supporting member, and a material which is intended as the superconducting material is introduced in the form of a slurry, in solution, or in gel form into the hollow body or pipe with one end of the hollow pipe temporarily blocked whereby the material is poured through the other end.

Next, the entire hollow pipe is heated from the outside and the solvent, that is a liquid medium is completely removed by vaporization. This causes the superconducting material to be coated onto the inner wall of the hollow pipe. Then by heating the coating for firing and oxidizing or reducing it repeatedly, a ceramic superconducting material, for example, an oxidized copper ceramic, is formed which has a molecular structure represented by $(A_{1-x}B_x)_y Cu_z O_w$, where x=0 to 1, y=2.0 to 4.0 and preferably 2.5 to 3.5, z=1.0 to 4.0 and preferably 2.5 to 3.5, and w=4.0 to 10.0 and preferably 6.0 to 8.0, and A is an element selected from Group IIIb of the Periodic Table, for example Y(yttrium), Gd(gadolinium), Yb(ytterbium), or other lanthanides, and B is an element selected from Group IIa of the Periodic Table, for example, Ba(barium) or Sr(strontium), Ca(calcium).

In the ceramic superconducting material used in the present invention, elements depicted by A and B other than those mentioned above can be added.

In the present invention, the coating of the superconducting ceramic material can be formed in a dual structure wherein a first layer is formed on the inside wall of the hollow support body, and then a second layer of ceramic material is coated over the first layer by repeating the process after the first layer of the ceramic material is sufficiently solidified. In addition, in this case, the types of A and B, and the values for x,y,z, and w may be changed.

In the present invention, if a large quantity of ceramic is to be filled into the inside of the hollow supporting body, an auxiliary body made of organic material in a hollow pipe form which is vaporized into carbon dioxide gas or the like when fired in an oxidizing atmosphere is provided in the interior of the hollow supporting body or pipe. A superconducting material, which may either be used with or without solvent, is then filled into the space between the hollow supporting body and the auxiliary body. After this, the auxiliary body is oxidized and vaporized by heating and firing, further, the inside ceramic material is oxidized to change into a ceramic superconducting member.

In the method of the present invention, the ceramic material coated on the inside surface of the supporting pipe formed from a metal or its alloy is changed through oxidization into a ceramic superconducting member represented by the general formula $(A_{1-x}B_x)_y Cu_z O_w$ which exhibits superconductivity. It is important that sufficient oxygen be added to this ceramic material when it is crystallized into the most suitable crystals. In the method of the present invention, the outside is covered with a metal, so that it is possible to adequately control the atmosphere on the ceramic material in the pipe. The hollow structure is effective in actual use in keeping the superconducting material at a lower temperature, because a gas (for example, liquid nitrogen) is introduced into the hollow space to cool the ceramic superconducting material to a temperature at which this ceramic exhibits superconductivity.

In the present invention, this process may be further repeated to form a structure with a plurality of layers.

In order to fabricate a pipe or coil using the metallic superconducting material as mentioned above, conventionally, first a wire is fabricated by this process, then this wire is wound around a prescribed base to form a coil.

However, this kind of wire forming using the ceramic superconducting body or winding the ceramic superconducting body around the base is extremely difficult.

For this reason, in the present invention, a pipe of metal or metallic compound is used, fabricated in the form of a previously prescribed pipe, coil or endless coil with its starting and terminating ends connected to each other. Its interior is filled by the introduction of a liquid in which a superconducting ceramic material is slurried or dissolved. It is therefore possible to essentially create the final form of a pipe of a ceramic material by providing a coating of the superconducting material on the inside wall of the metal pipe.

In addition, by winding a plurally of turns in coil using the pipe of the present invention, a superconducting magnet can be formed. Also, by connecting the starting and terminating ends of this coil through the ceramic material having the electrical resistance of zero, an endless coil is obtained. There is no loss of current in this coil, so it is possible to use it as an electrical energy storage device.

[FIRST EXAMPLE]

In this example, a composition was used in the expression $(A_{1-x}B_x)_yCu_zO_w$, where A is yttrium in the form $Y_2O_3$, B is barium in the form $BaCO_3$, and copper is used in the CuO form. These chemicals were used at 99.95% or greater in purity. The x,y,z, and w used here were adjusted to the form $(y_{1-x}Ba_x)Cu_3O_{6-8}$ wherein the notation "$O_{6-8}$" is used to reflect the fact that the amount of oxygen atoms in the resulting molecule may deviate from six to eight. These raw materials were blended in an agate mortar, compacted into tablets at a pressure of 300 kg/cm$^2$, and pre-fired in air, first at 700° C. for 3 hours, then at 1000° C. for 10 hours. The tablets were then pulverized into powder once again. The average particle size was made 100 µm or less, for example, about 10 µm. This mixture was enclosed in a capsule and again compacted at 500 kg/cm$^2$ to form tablets. These tablets were then fully fired in an oxidizing atmosphere, for example, in air, at 800° C. to 1000° C. for 10 hours.

Next the fact that this fired material had a Tc onset of 95° K. or greater and a Tco of 77° K. or greater was confirmed from the voltage, current, and temperature characteristics.

The tablets were once again pulverized into a fine powder. The average particle size ranged from 0.05 µm up to 100 µm, for example, 3 µm. In this process, an effort was made during pulverization to avoid destroying the basic crystal structure.

This powder was slurried or dissolved in a liquid, for example, freon liquid, or an alcohol such as ethanol, or another liquid.

This liquid was poured into the hollow support body shown in FIG. 1 (which is a metal pipe 2 fabricated, for example, from copper or a copper alloy, such as a NiCu alloy), with its opposite end blocked. The inner wall of the pipe 2 was coated to a uniform thickness with the ceramic powder by rotating, turning and vertically vibrating the pipe 2 from end to end so that the powder is adhered to the wall while the entire pipe 2 was heated to a temperature of 100° C. to 400° C.

In this way, the solvent was removed from the inside of the pipe 2 resulting in the inner wall with a ceramic powder coating 3 formed thereon.

It may be mixed with propylene glycol, octyl alcohol, peptyl alcohol, and the like, in paste form to make the coating adhere more easily to the inner wall.

After this, while oxygen or a mixture of oxygen and argon gas was introduced into the hollow section for oxidizing, the ceramic material was heated and fired at 500° C. to 1100° C., for example, at 600° C. for 3 hours, then additionally at 800° C. for 5 hours to cause the ceramic to adhere to the inner wall.

By repeating this type of process 1 to 5 times, the ceramic material was caused to adhere to the inside of the pipe to an average thickness of 50 µm to 1 cm (as a representative figure, 0.5 mm to 5 mm). In this way, the pipe 1 as shown in FIG. 1 was fabricated comprising the hollow supporting body 2 and the superconducting ceramic material 3 with the empty space 4 provided in the inside of the hollow supporting body 2.

In the present example, the pipe has a cylindrical hollow supporting body. However, it may also be a square hollow supporting body, and other shapes can also be used.

The superconducting ceramic pipe in this example had a Tc value 5° to 20° K. lower than that made from the tablet. This decrease in $T_c$ can be compensated for by increasing the $T_c$ of the tablet superconductor.

In addition, the length in this design can be changed from several centimeters to several scores of meters. Also, the thickness can be changed from a diameter of several millimeters to one of several centimeters.

[SECOND EXAMPLE]

In this example, a dual pipe structure was made in which a hollow second pipe made of an organic material with a diameter smaller than that of a first hollow pipe as mentioned in the first example was placed beforehand inside the hollow first pipe. Then the material formed by grinding the fired superconducting material fabricated in the intermediate process of the first example was filled between the two pipes.

Oxygen was passed through the interior of the second pipe of organic material and the entire assembly was heated. The organic material was carbonized at about 300° C., and further as the temperature was raised, vaporized to carbon dioxide gas and driven off. After this, the filled ceramic material was completely oxidized to produce the superconducting material. This process was completed at a temperature between 600° C. and 1100° C., for example, at 800° C. to 1000° C., for 10 to 20 hours.

Thus, it was possible to fabricate a metal pipe provided with a superconducting ceramic material on its inside with a hollow section formed therein In this example, it was found that it is effective to fill the superconducting ceramic material between the hollow supporting body or first pipe and the hollow auxiliary body or second pipe in the form of powder mixed in a flowable organic paste which is easily vaporized.

Unless specifically stated, the rest of the method of this example is substantially identical to that of the first example.

[THIRD EXAMPLE]

Figure 2:
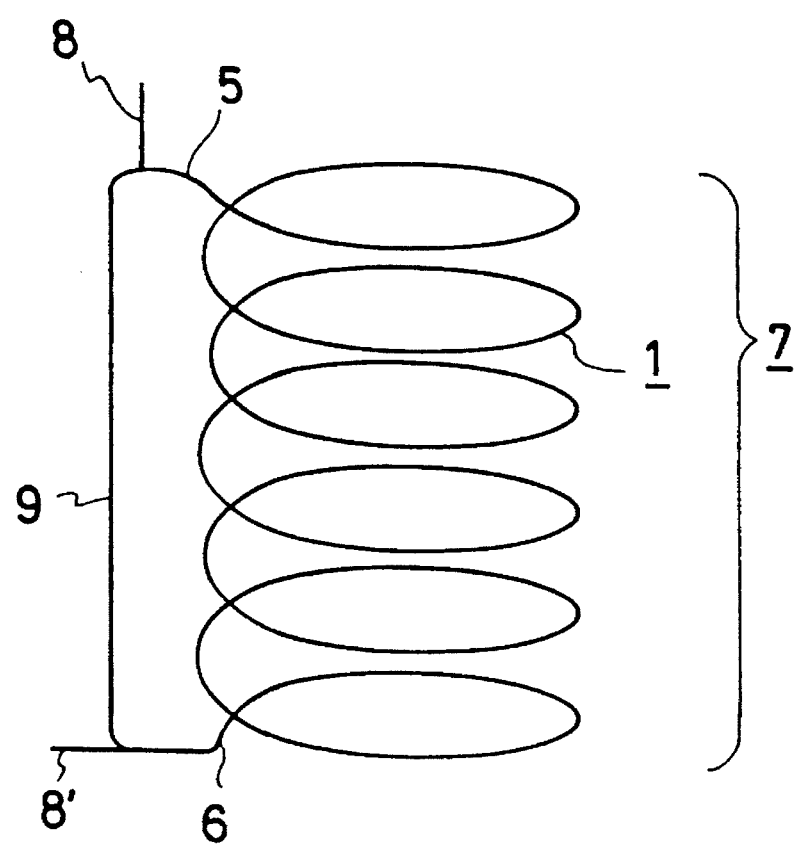
FIG. 2 shows an example of an electrical storage device using the pipe of the present invention.

In this example, an endless coil was used. FIG. 2 shows a vertical cross section of the endless coil. This endless coil can be used as a battery for electric energy generated by a solar cell and the like.

As can be seen from this diagram, a pipe which was fabricated from a metal or a precious metal alloy, with a previously formed hollow space, as in the first example, was formed in the shape of a coil 7. In addition, a starting end 5 and a terminating end 6 were detachably connected to each other through a hollow pipe 4. A resistance was provided in parallel to this connector section as a means for applying electrical power. This endless coil has a filler opening 8. This filler opening 8 can be used as input and output terminals for electrical energy.

Here, using the same method as in the first example, the superconducting ceramic material was slurried or dissolved in a liquid, which was poured into the filler opening 8. It can also be filled as in the second example.

To dry the superconducting ceramic material, the unnecessary solvent was driven off in the form of vapor through the openings 8, 8' and the inside of the pipe was dried. Also, in the same way as in the first example, an oxidizing gas was introduced and the ceramic was dried.

In this way, the endless coil 7 with a hollow interior could be fabricated using the pipe 1 of which the inner wall was coated with the superconducting ceramic material. Its Tco was experimentally determined to be 78° K. However, by proper selection of the superconducting ceramic material, a higher Tco can be obtained. Also, a closed circuit of zero resistance can be obtained with the endless coil introducing liquid nitrogen into the hollow section of the endless coil, so that it can be used as an electric energy storage device.

[FOURTH EXAMPLE]

In this example, in the expression $(A_{1-x}B_x)_yCu_zO_w$, A was Yb and B was Ba. Therefore, the Tco of the pipe formed was maintained at 85° K. Otherwise this example was substantially the same as the first and second examples.

With this structure for the present invention, with the outside covered with metal, the oxidation of the ceramic material on the inside and the process can be controlled by the type and amount of gas fed into the hollow section. Further, it is important in the present invention to provide a central section to relieve the stress and strain during production because the volume is slightly enlarged by oxidation of the superconducting ceramic material. Also, this is effective for reducing the difference in the coefficient of expansion between the metal and ceramic materials.

In such a pipe structure formed for the present invention, the hollow inner section is filled with a cooling liquid such as liquid nitrogen, so that continuous and simultaneous direct cooling of the pipe and the ceramic is possible, for which temperature control is of the most importance.

In addition, it is also possible to use alloy other than copper or a copper alloy as the outside metal. However, use of copper or a copper alloy makes it possible to weld the outside of the pipe, so that it can be used as part of an electrical device. Using copper or a copper alloy as the metal or metallic compound especially makes it possible to widen the application of this pipe, for example, to use it in electrical parts.

A preferred method of preparing the superconducting ceramic material in the present invention is to powder a previously prepared ceramic material of this type and mix it with a liquid. Also, a solidifying method and other methods can also be used.

In another aspect of the present invention, a wire drawing step can be introduced to form a wire as in the following example, which is then wound around a substrate or base to form a coil of the metallic superconducting material

[FIFTH EXAMPLE]

The starting material for this example was the hollow pipe of the first or second example. It was heated between 800° C. and 1100° C., for example, at 1000° C. The outside of the pipe was formed with soft copper. It has a low melting point of 1083° C. and has good malleability and ductility. Therefore, upon the implementation of heat treatment of the superconducting ceramic material residual stresses are suppressed so that cracks are not produced.

In practice, the copper pipe had an outside diameter of 10 mm and an inside diameter of 8 mm, the average thickness of the ceramic material was 3 mm, and the hollow section was about 2 mm in diameter. The whole pipe was heated from the outside so that it became elongated to form a long wire as it is forced through a jig. Consequently, the diameter of the pipe was reduced and it was possible to completely eliminate the hollow space therefrom. With this process, even when a thin wire is formed, because a hollow pipe was used as the starting material, incidents such as a superconducting phenomenon not being produced because of remained stress in a ceramic, can be avoided.

In this manner a pipe with an outer diameter of 6 mm can be stretched to a length about three times that of the starting material.

As this technology develops, it should be possible to stretch pipe with a diameter as small as 1 mm to 2 mm, to a length 50 to 5000 times the original.

Thus, when the structure of the metallic pipe and the superconducting material coated thereon is subjected to wire-drawing, because a hollow space is contained therein, the ceramic material does not fail upon wire-drawing.

The superconducting ceramic material for use in accordance with the present invention also may be prepared consistent with the stoichiometric formula $(A_{1-x}B_x)_yCu_zO_w$, where A is one or more elements of Group IIIb of the Periodic Table, e.g. the rare earth elements, B is one or more elements of Group IIa of the Periodic Table, e.g. the alkaline earth metals including beryllium and magnesium, and x=0 to 1, y=2.0 to 4.0, preferably 2.5 to 3.5, z=1.0 to 4.0, preferably 1.5 to 3.5, and w=4.0 to 10.0, preferably 6.0 to 8.0

Also superconducting ceramics for use in accordance with may be presented by the stoichiometric formula $(A_{1-x}B_x)_yCu_zO_w$ where A is one or more elements of Group Va of the Periodic Table, e.g. Bi, Sb and As; B is one or more elements of Group IIa of the Periodic Table, e.g. the alkaline earth metals including beryllium and magnesium, and x=0 to 1, y=2.0 to 4.0, preferably 2.5 to 3.5, z=1.0 to 4.0, preferably 1.5 to 3.5, and w=4.0 to 10.0, preferably 6.0 to 8.0.

One example of the formula is $YBa_2Cu_3O_x$ (x=6 to 8), and examples of the latter formula is $BiSrCaCu_2O_x$ and $Bi_4Sr_3Ca_3Cu_4O_x$. In addition, the composition $Bi_4(Sr_yCa_2)Cu_4O_x$ is possible for such purposes and its Tc is 40 to 60 when the value of y is about 1.5. The Tonset and Tco of the composition $Bi_4Sr_4Ca_2Cu_4O_x$ are 110° K. and 79° K., respectively. The value of x in the above formulae is from 6 to 10, for example about 8.1.

The stoichiometric formulae mentioned above can be determined for example by X-ray diffraction.

What is claimed is:

1. A method for manufacturing a pipe from a superconducting ceramic material comprising the steps of:

providing a hollow supporting body of metal or a metallic alloy having a hollow inside section therein;

introducing into the hollow inside section of the hollow supporting body a liquid into which is mixed a superconducting material comprising an oxidized copper ceramic;

drying the above liquid, so that the superconducting ceramic material is coated on the inside of the supporting body with a hollow space kept therein;

firing the supporting body and the ceramic material in an oxidizing atmosphere; and wire drawing said hollow supporting body containing said superconducting ceramic material.

2. The method of claim 1, wherein the oxidized copper ceramic has a formula represented by $(A_{1-x}B_x)_yCu_zO_w$, where x=0 to 1, y=2.0 to 4.0, z=1.0 to 4.0, and w=4.0 to 10.0; A is an element selected from the group of Y (yttrium), Gd (gadolinium), Yb (ytterbium), and other lanthanides; B is selected from the group of Ba (barium), Sr (strontium), Ca (calcium), Mg (magnesium), and Be (beryllium).

3. A method for manufacturing a pipe from a superconducting ceramic material comprising the steps of:

providing a hollow supporting body of metal or a metallic alloy having a hollow inside section therein, providing a hollow auxiliary body on the inner side of the supporting body with a hollow space kept therein, the hollow auxiliary body being made of a material which is removed through evaporation during firing in an oxidizing atmosphere, introducing a superconducting ceramic material into a space formed between the supporting body and the auxiliary body; and firing the supporting body, the hollow auxiliary body and the ceramic material in an oxidizing atmosphere.

4. The method of claim 3, wherein the auxiliary body for forming a hollow space is a pipe made from an organic material.

5. A method for manufacturing a pipe from a superconducting ceramic material comprising the steps of:

providing a hollow supporting body of metal or a metallic alloy having a hollow inside section therein;

introducing powder of an oxide superconducting ceramic material into the hollow inside section;

firing the ceramic material in an oxidizing atmosphere together with the supporting body; and wire drawing said hollow supporting body containing said superconducting ceramic material.

6. The method of claim 5 wherein the crystallization of the superconducting ceramic material is secured preventing the development of cracks therein when the wire drawing is performed.

7. The method of claim 5 wherein said introducing step is carried out with a hollow space kept in the hollow supporting body.

8. The method as defined in claim 5, wherein said step of wire drawing is carried out subsequent to said step of firing the supporting body and the ceramic material.

9. The method as defined in claim 5, wherein said oxide material comprises an oxidized copper ceramic having a formula represented by $(A_{1-x}B_x)_yCu_zO_w$, where x=0 to 1, y=2.0 to 4.0, z=1.0 to 4.0, and w=4.0 to 10.0; A is an element selected from a group including Y (yttrium), Gd (gadolinium), Yb (ytterbium), and other lanthanides; B is selected from a group including Ba (barium) or Sr (Strontium), Ca (calcium), Mg (magnesium), and Be (beryllium).

10. A method as in claim 5 where the hollow supporting body is reactive with said oxide superconducting ceramic material at least a predetermined firing temperature and where the hollow supporting body is in direct contact with said oxide superconducting ceramic material and where said firing the ceramic material in an oxidizing atmosphere together with the supporting body occurs at said predetermined firing temperature.

11. A method as in claim 10 where said metal or metallic oxide is cooper or a copper compound.

12. The method as defined in claims 1, 3, and 5 further comprising the step of winding the step of winding said supporting body containing said superconducting material into a coil having first and second ends.

13. The method as defined in claim 12, further comprising the step of connecting said first and second ends so as to form an endless coil.

14. The method of claims 1, 3 and 5 wherein said superconducting ceramic material comprises an oxidized copper ceramic.

15. The method of claim 14, wherein the oxidized copper ceramic has a formula represented by $(A_{1-x}B_x)_yC_{uz})_w$, where x=0 to 1, y=2.0 to 4.0, z=1.0 to 4.0, and w=4.0 to 10.0; A is an element selected from the group of y (yttrium), Gd (gadolinium, Yb (ytterbium), and other lanthanides; B is selected from the group of Ba (barium), Sr (strontium), Ca (calcium), Mg (magnesium), and Be (beryllium).

16. The method of claims 1, 3, and 5 wherein said metal or metallic alloy is cooper or NiCu.

17. A method as defined in claim 5 where said power includes at least all of the non-oxide components comprising said oxide superconducting ceramic material.

18. The method as defined in claim 17 wherein said power includes an oxygen containing component.

19. A method for manufacturing a pipe from a superconducting ceramic material comprising the steps of:

providing a hollow supporting body of metal or a metallic alloy having a hollow inside section therein;

introducing powder of an oxide superconducting ceramic material into the hollow inside section; and firing the ceramic material in an oxidizing atmosphere together with the supporting body.

20. The method as defined in claim 19 wherein said oxide material comprises an oxidized copper ceramic having a formula represented by $(A_{1-x}B_x)_yCU_zO_w$, where x=0 to 1, y=2.0 to 4.0, z=1.0 to 4.0, and w=4.0 to 10.0; A is an element selected from a group including Y (yttrium), Gd (gadolinium), Yb (ytterbium), and other lanthandides; B is selected from a group including Ba (barium) or Sr (Strontium), Ca (calcium), Mg (magnesium) and Be (beryllium).

21. The method as defined in claim 19, further comprising the step of winding said supporting body containing said superconducting material into a coil having first and second ends.

22. The method as defined in claim 21, further comprising the step of connecting said first and second ends so as to form an endless coil.

23. A method as in claim 19 where the hollow supporting body is reactive with said oxide superconducting ceramic material at least a predetermined firing temperature and where the hollow supporting body is in direct contact with said oxide superconducting ceramic material and where said firing the ceramic material in an oxidizing atmosphere together with the supporting body occurs at said predetermined firing temperature.

24. A method as in claim 23 where said metal or metallic oxide is copper or a copper compound.

25. A method as defined in claim 19 where said power includes at least all of the non-oxide components comprising said oxide superconducting ceramic material.

26. The method as defined in claim 25 wherein said powder includes an oxygen containing component.

27. Method of producing a normal metal-clad superconductive body, the method comprising:

a) preparing an intermediate body comprising normal metal cladding material surrounding a quantity of material that comprises superconductive oxide material; and b) forming the body from the intermediate body by means of one or more shape-changing operations, characterized in that the normal metal cladding material and the superconductive oxide material are heat treated in an oxidizing atmosphere where an ambient oxygen-containing atmosphere comes into contact with the superconductive oxide material through a hollow space within the oxide superconductive material.

28. Method of claim 27, comprising providing said normal metal cladding material that comprises a metal selected from the group consisting of copper or copper compound.

29. Method of claim 27, wherein the body is an elongate body, and comprising providing said superconductive material that comprises (IIa, IIIa) cuprate powder where IIa is an element selected from the Group IIa of the Periodic table and IIIa is an element selected from the Group IIIa of the Periodic table, and said normal metal cladding material that comprises copper or copper compound.

30. Method of claim 27, wherein the shape changing operation comprises a cross section-reducing operation.

31. A method as defined in claim 27 where said quantity of material includes at least all of the non-oxide components comprising an oxide superconducting ceramic material.

32. The method as defined in claim 31 wherein said quantity of material includes an oxygen containing component.

\* \* \* \* \*